(12) United States Patent
    Liao

(10) Patent No.: US 12,641,730 B2
(45) Date of Patent: May 26, 2026

(54) CIRCUIT BOARD WITH EMBEDDED ELEMENTS AND METHOD FOR FABRICATING THE SAME

(71) Applicant: Boardtek Electronics Corporation, Taoyuan City (TW)

(72) Inventor: Chung-Hsing Liao, Taoyuan City (TW)

(73) Assignee: BOARDTEK ELECTRONICS CORPORATION, Taoyuan City (TW)

( * ) Notice: Subject to any disclaimer, the term of this patent is extended or adjusted under 35 U.S.C. 154(b) by 234 days.

(21) Appl. No.: 18/668,630

(22) Filed: May 20, 2024

(65) Prior Publication Data

US 2025/0358936 A1      Nov. 20, 2025

(51) Int. Cl.
    *H05K 1/18*      (2026.01)
    *H05K 1/02*      (2006.01)
    *H05K 1/183*     (2026.01)
    *H05K 1/185*     (2026.01)
    *H05K 3/40*      (2006.01)
    *H05K 3/46*      (2006.01)

(52) U.S. Cl.
    CPC .......... *H05K 1/188* (2013.01); *H05K 1/0204* (2013.01); *H05K 1/183* (2013.01); *H05K 3/4038* (2013.01); *H05K 3/465* (2013.01); *H05K 2201/062* (2013.01); *H05K 2203/0502* (2013.01); *H05K 2203/1131* (2013.01)

(58) Field of Classification Search
    CPC ...... H05K 1/188; H05K 1/0204; H05K 1/183; H05K 3/4038; H05K 3/465; H05K 2201/0262; H05K 2203/0502; H06K 2203/1131

USPC ......................................................... 361/761
See application file for complete search history.

(56) References Cited

U.S. PATENT DOCUMENTS

| | | | |
|---|---|---|---|
| 11,051,391 B2 * | 6/2021 | Tuominen ............ | H05K 1/0201 |
| 2008/0315398 A1 * | 12/2008 | Lo .......................... | H05K 1/185 |
| | | | 257/706 |
| 2019/0246501 A1 | 8/2019 | Morianz et al. | |

FOREIGN PATENT DOCUMENTS

| | | |
|---|---|---|
| KR | 100789530 B1 | 12/2007 |
| TW | 202318933 A | 5/2023 |

* cited by examiner

*Primary Examiner* — Binh B Tran
(74) *Attorney, Agent, or Firm* — MUNCY, GEISSLER, OLDS & LOWE, P.C.

(57) ABSTRACT

A circuit board with embedded elements and a method for fabricating the same are provided. The circuit board with embedded elements includes a circuit substrate, a conductive structure, an electronic component and a thermoplastic insulation layer. The conductive structure is embedded in and electrically connected to the circuit substrate, while the conductive structure has a trench. The electronic component is disposed inside this trench and electrically connected to the conductive structure. The thermoplastic insulation layer covers the electronic component and the inner wall of the trench, and the surface of the thermoplastic insulation layer is flush with the surface of the circuit substrate. The heat deflection temperature of the thermoplastic insulation layer is between 376° C. and 410° C.

15 Claims, 7 Drawing Sheets

100

CIRCUIT BOARD WITH EMBEDDED ELEMENTS AND METHOD FOR FABRICATING THE SAME

BACKGROUND

Technical Field

The present disclosure relates to a circuit board and the method for fabrication of the same. More particular, the present disclosure relates to the circuit board including embedded elements and the method for fabrication of the same.

Description of Related Art

In general, electronic components (e.g. dies or chips) in silicon carbide (SiC) power modules are electrically connected to the circuit layers of these modules by wire bonding. However, since most silicon carbide power modules should perform high-frequency switching, the parasitic inductance which is caused by wire bonding is aggravated. Thus, the performances of those power modules are affected. In order to lessen the parasitic inductance, power modules which electronic components are embedded in circuit substrates are developed. Nevertheless, when electronic components are embedded in circuit substrates, the heat dissipation of power modules can be reduced. As a result, when the temperature of a power module is increased by the heat general by the electronic components, the insulation layer which surrounds those electronic components is prone to be destroyed by the heat, thereby affecting the performance of the power module.

SUMMARY

Accordingly, the disclosure is to provide a circuit board with embedded elements, thereby increasing the performance of the circuit board.

At least one embodiment of the disclosure provides a method for fabrication of the aforementioned circuit board with embedded elements.

At least one embodiment of the disclosure provides a circuit board with embedded elements. The circuit board with embedded elements includes a circuit substrate, a conductive structure, an electronic component and a thermoplastic insulation layer. The conductive structure which has a trench is disposed inside and electrically connected to the circuit substrate. The electronic component is disposed inside the trench of the conductive structure and is electrically connected to the conductive structure. The thermoplastic insulation layer covers the electronic component and an inner wall of the trench, and a first surface of the thermoplastic insulation layer is flush with a second surface of the circuit substrate. The heat deflection temperature of the thermoplastic insulation layer is between 376° C. and 410° C.

At least in one embodiment of the disclosure, a thickness of the thermoplastic insulation layer is larger than 10 μm.

At least in one embodiment of the disclosure, the circuit board with embedded elements further includes two circuit layer structures. The circuit substrate is disposed between and electrically connected to the circuit layer structures. One of the circuit layer structures includes an insulation layer disposed on the circuit substrate and covering the thermoplastic insulation layer and a circuit layer disposed on the insulation layer. The insulation layer is located between the circuit layer and the thermoplastic insulation layer.

At least in one embodiment of the disclosure, the circuit board with embedded elements further includes a thermal conductive insulation layer disposed on the circuit substrate. The conductive structure is located between the thermal conductive insulation layer and the second surface of the circuit substrate.

At least in one embodiment of the disclosure, the circuit board with embedded elements further includes an insulation material disposed on the conductive structure and distributed between the conductive structure and the circuit substrate. The edge surface of the insulation material is flush with the second surface of the circuit substrate.

At least in one embodiment of the disclosure, the circuit board with embedded elements further includes a metal sintering layer disposed on the conductive structure and located between the conductive structure and the electronic component.

At least in one embodiment of the disclosure, the metal sintering layer includes silver.

At least in one embodiment of the disclosure, the circuit board with embedded elements further includes a non-plating through hole connecting two opposite sides of the circuit board with embedded elements.

At least one embodiment of the disclosure provides a method for fabricating a circuit board with embedded elements. The method includes providing a conductive structure having a trench. The method includes disposing an electronic component inside the trench of the conductive structure. After the electronic component is disposed inside the trench, a thermoplastic insulation layer is disposed on the conductive structure, so that the thermoplastic insulation layer covers the electronic component and the trench. The heat deflection temperature of the thermoplastic insulation layer is between 376° C. and 410° C. The method includes providing an initial circuit substrate. After the thermoplastic insulation layer is disposed on the conductive structure, the conductive structure is disposed inside the initial circuit substrate, where a first surface of the thermoplastic insulation layer is exposed on a second surface of the initial circuit substrate, and the first surface is flush with the second surface. After the conductive structure is disposed inside the initial circuit substrate, a first metal layer of the initial circuit substrate is patterned to form a circuit layer, and a circuit substrate is formed from the initial circuit substrate.

At least in one embodiment of the disclosure, the step of disposing the electronic component inside the trench of the conductive structure includes disposing a metal sintering material on a bottom of the trench. After the metal sintering material is disposed on the bottom of the trench, the electronic component is disposed on the metal sintering material. The method further includes adhering the metal sintering material between the bottom of the trench and the electronic component to form a metal sintering layer.

At least in one embodiment of the disclosure, the method further includes adhering one thermal conductive insulation layer to one of the second circuit layers of the circuit substrate. The conductive structure is located between the thermal conductive insulation layer and the thermoplastic insulation layer.

At least in one embodiment of the disclosure, the method further includes adhering at least one insulation substrate to each of two opposite third surfaces of the circuit substrate separately, so that two insulation layers are formed. The circuit substrate is located between the insulation layers, and one of the insulation layers covers the electronic component and the trench. Afterward, two second metal layers are adhered to the insulation layers separately, and each of the insulation layers is located between one of the second metal layers and the circuit substrate. After the second metal layers are adhered to the insulation layers, the second metal layers are patterned, so that each of second circuit layers are formed from each of the second metal layers. The second circuit layers are electrically connected to the electronic component.

At least in one embodiment of the disclosure, the method further includes forming a plurality of conductive via on the second metal layers after the second metal layers are adhered, wherein. The second circuit layers are electrically connected to the electronic component through the plurality of conductive via.

At least in one embodiment of the disclosure, the step of disposing the conductive structure inside the initial circuit substrate includes removing a part of the initial circuit substrate to form an opening on the initial circuit substrate. The opening connects two opposite sides of the initial circuit substrate with each other. The method further includes disposing an adhesive material on the second surface of the initial circuit substrate, and the adhesive material covers the opening. After the adhesive material is disposed, the conductive structure, the electronic component and the thermoplastic insulation layer are disposed inside the opening. The thermoplastic insulation layer is adhered to the adhesive material, and the trench of the conductive structure within the opening faces to the adhesive material. After the conductive structure, the electronic component and the thermoplastic insulation layer are disposed inside the opening, an insulation material is disposed inside the opening, and the insulation material is distributed between the conductive structure and the initial circuit substrate. After the insulation material is disposed, the adhesive material is removed, so that the thermoplastic insulation layer is exposed.

At least in one embodiment of the disclosure, the width of the opening is larger than the width of the conductive structure, and the difference between the width of the opening and the width of the conductive structure is larger than 0.5 mm.

According to the aforementioned embodiments, the thermoplastic insulation layer which covers the surfaces of electronic component and the conductive structure is disposed on the electronic component and the trench of the conductive structure. Since the heat deflection temperature of the thermoplastic insulation layer is between 376° C. and 410° C., the thermoplastic insulation layer is not deformed by heating when the temperature of the thermoplastic insulation layer reaches between 200° C. and 250° C. due to the heat generated by the electronic component. Therefore, the surround of the thermoplastic insulation layer which covers the electronic component is prevented from damaging, thereby, sufficient insulation effect is provided. Thus, the performance of the circuit board with embedded elements is improved.

BRIEF DESCRIPTION OF THE DRAWINGS

To illustrate more clearly the aforementioned and the other features, merits, and embodiments of the present disclosure, the description of the accompanying figures are as follows.

DETAILED DESCRIPTION

Figure 1:
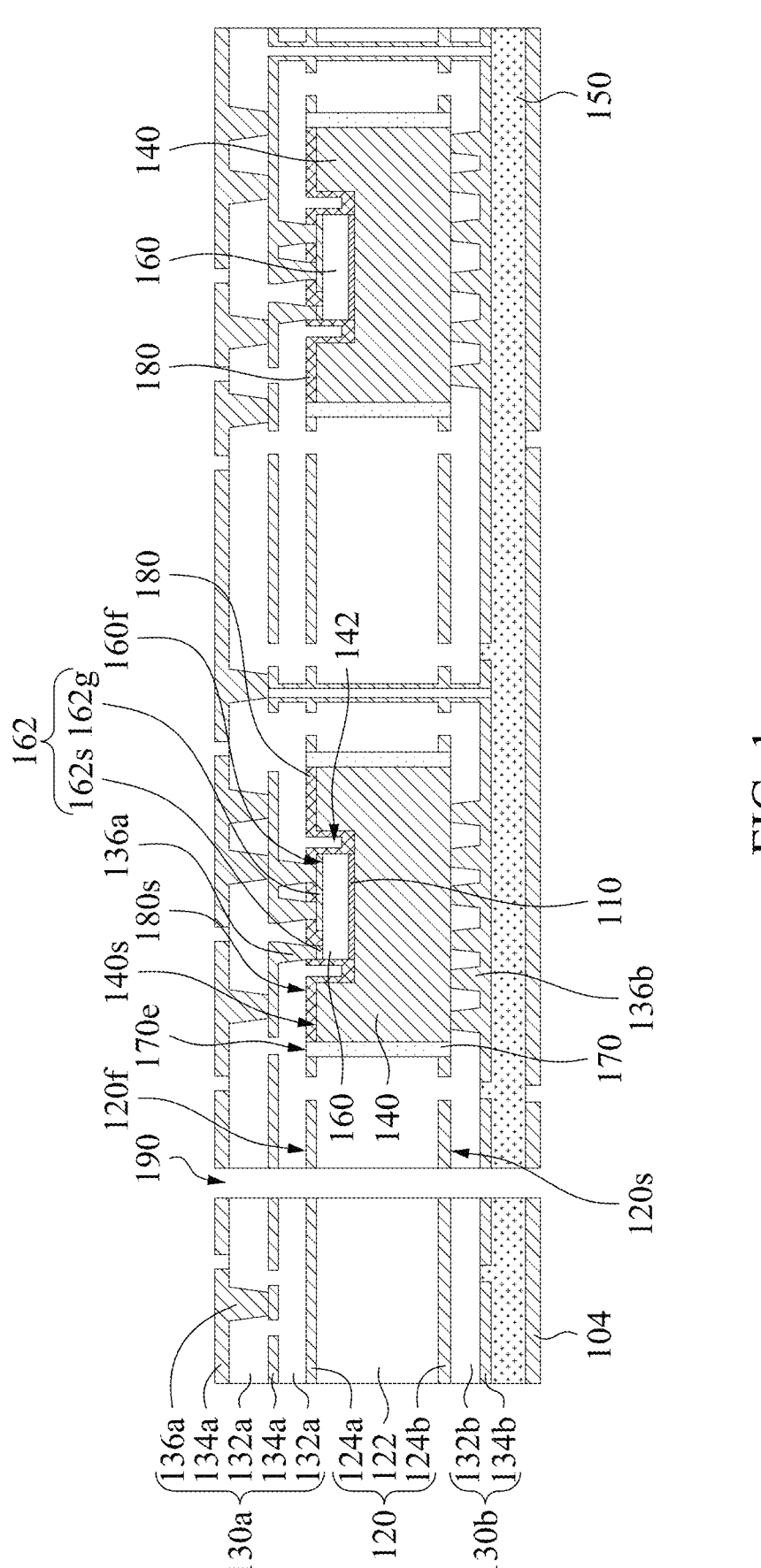
FIG. 1 illustrates a cross-sectional view of a circuit board with embedded elements in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, the dimensions (such as lengths, widths and thicknesses) of components (such as layers, films, substrates and regions) in the drawings are enlarged not-to-scale, and the number of components may be reduced in order to clarify the technical features of the disclosure. Therefore, the following illustrations and explanations are not limited to the number of components, the number of components, the dimensions and the shapes of components, and the deviation of size and shape caused by the practical procedures or tolerances are included. For example, a flat surface shown in drawings may have rough and/or non-linear features, while angles shown in drawings may be circular. As a result, the drawings of components shown in the disclosure are mainly for illustration and not intended to accurately depict the real shapes of the components, nor are intended to limit the scope of the claimed content of the disclosure.

Further, when a number or a range of numbers is described with "about," "approximate," "substantially," and the like, the term is intended to encompass numbers that are within a reasonable range considering variations that inherently arise during manufacturing as understood by one of ordinary skill in the art. In addition, the number or range of numbers encompasses a reasonable range including the number described, such as within +/−30%, +/−20%, +/−10% or +/−5% of the number described, based on known manufacturing tolerances associated with manufacturing a feature having a characteristic associated with the number. The words of deviations such as "about," "approximate," "substantially," and the like are chosen in accordance with the optical properties, etching properties, mechanical properties or other properties. The words of deviations used in the optical properties, etching properties, mechanical properties or other properties are not chosen with a single standard.

The circuit board with embedded elements 100 is disclosed. Referring to FIG. 1, the circuit board with embedded elements 100 includes the circuit substrate 120, the conductive structure 140, the electronic component 160 and the thermoplastic insulation layer 180. The conductive structure 140 is disposed inside the circuit substrate 120 and is electrically connected to the circuit substrate 120. The circuit substrate 120 includes the insulation layer 122 and includes the circuit layer 124a and the circuit layer 124b which are located on two opposite sides of the insulation layer 122.

The conductive structure 140 has the trench 142, and the opening of this trench 142 faces to one side of the circuit substrate 120. Specifically, the opening faces to the side of the circuit substrate 120 where the circuit layer 124a is disposed. The conductive structure 140 may be a conductive component, such as a copper bulk or a lead frame. Although each conductive structure 140 in the embodiment has only one trench 142, the disclosure is not limited to this embodiment. In other embodiments, each trench 142 may have more than one trench 142, such as two trenches 142.

The electronic component 160 is disposed inside the trench 142 of the conductive structure 140 and is electrically connected to the conductive structure 140. The electronic component 160 may be unpackaged as a die or packaged as a chip. The electronic component 160 may include one layer of circuit layer 162 which is disposed on the plane 160f of the electronic component 160. The circuit layer 162 includes the gate region 162g and the source region 162s. In addition, the circuit layer 162 further includes the drain region which is not illustrated in figures, while the ends of pads on the aforementioned gate region, source region and drain region (not shown) are covered by the thermoplastic insulation layer 180.

Although only one electronic component 160 is disposed inside one trench 142 in the embodiment, the disclosure is not limited to this embodiment. In other embodiments, more than one electronic component 160, such as two electronic components 160, may be disposed inside one trench 142. Furthermore, even though the circuit board with embedded elements 100 in FIG. 1 includes only two conductive structures 140, the disclosure is not limited to this embodiment. In other embodiments, the circuit board with embedded elements 100 may include any quantity of the conductive structure 140, such as one conductive structure 140 or three conductive structures 140.

The thermoplastic insulation layer 180 covers the electronic component 160 and the inner wall of the trench 142, and the surface 180s of the thermoplastic insulation layer 180 is flush with the surface 120f of the circuit substrate 120. Moreover, the thermoplastic insulation layer 180 may cover the surface 140s of the conductive structure 140 which is outside the trench 142. It is worth mentioning, the material of the thermoplastic insulation layer 180 may include insulation material with heat resistance, such as polyimide (PI), epoxy resin, inorganic filler or similarity thereof. The heat deflection temperature of the thermoplastic insulation layer 180 is between 376° C. and 410° C.

As a result, when the temperature of the thermoplastic insulation layer 180 reaches between 200° C. and 250° C. due to the heat generated by the electronic component 160, the thermoplastic insulation layer 180 is not deformed during the heating. Thus, the surround of the thermoplastic insulation layer 180 which covers the electronic component 160 is prevented from damaging, so that the heating influence on the insulation effect of the electronic component 160 provided by the thermoplastic insulation layer 180 is reduced. In addition, the thickness of the thermoplastic insulation layer 180 may be larger than 10 μm in the embodiment, so that the insulation effect on the electronic component 160 is increased.

The circuit board with embedded elements 100 further includes the metal sintering layer 110. The metal sintering layer 110 is disposed on the conductive structure 140 and is located between the conductive structure 140 and the electronic component 160. In other words, the electronic component 160 is connected to the conductive structure 140 through the metal sintering layer 110. It should be noted that the metal sintering layer 110 may include metal materials which have high thermal conductivity, such as silver, so that the efficiency of thermal conduction from the electronic component 160 to the conductive structure 140 is increased.

The circuit board with embedded elements 100 further includes the circuit layer structure 130a and the circuit layer structure 130b. The circuit layer structure 130a is located on the circuit layer 124a of the circuit substrate 120, while the circuit layer structure 130b is located on the circuit layer 124b of the circuit substrate 120. The circuit substrate 120 is located between the circuit layer structure 130a and the circuit layer structure 130b, while the circuit layer structure 130a and the circuit layer structure 130b are electrically connected to the circuit substrate 120. Each of the circuit layer structure 130a and the circuit layer structure 130b includes at least one insulation layer and at least one circuit layer.

Specifically, the circuit layer structure 130a includes two insulation layers 132a and two circuit layers 134a. The lower insulation layer 132a is disposed on the circuit layer 124a of the circuit substrate 120 and covers the thermoplastic insulation layer 180, and the lower circuit layer 134a is disposed on the lower insulation layer 132a. The lower insulation layer 132a is located between the lower circuit layer 134a and the thermoplastic insulation layer 180. The upper insulation layer 132a and the upper circuit layer 134a are disposed on the lower circuit layer 134a in order, while two circuit layers 134a are electrically connected to each other through the plurality of conductive via 136a. Furthermore, the circuit layers 134a of the circuit layer structure 130a may be electrically connected to the gate region 162g and the source region 162s of the circuit layer 162 in the electronic component 160 through the plurality of conductive via 136a.

In addition, the circuit layer structure 130b includes one insulation layer 132b and one circuit layer 134b, while the insulation layer 132b is disposed on the circuit layer 124b of the circuit substrate 120. The circuit layer 134b is disposed on the insulation layer 132b, and the insulation layer 132b is located between the circuit layer 134b and the circuit substrate 120. Furthermore, the circuit layer 134b is electrically connected to the conductive structure 140 and the circuit layer 124b of the circuit substrate 120 through the plurality of conductive via 136b.

It is worth mentioning, the circuit board with embedded elements 100 further includes the thermal conductive insulation layer 150 which is disposed on the circuit substrate 120. The conductive structure 140 is located between the thermal conductive insulation layer 150 and the surface 120f of the circuit substrate 120. In other words, the thermal conductive insulation layer 150 is disposed on the surface 120s which is opposite to the surface 120f of the circuit substrate 120. In the embodiment, the circuit layer structure 130b exists between the thermal conductive insulation layer 150 and the circuit substrate 120.

Specifically, the thermal conductive insulation layer 150 is disposed on the circuit layer structure 130b which is located on the circuit substrate 120, and the circuit layer 134b of the circuit layer structure 130b is located between the insulation layer 132b and the thermal conductive insulation layer 150. Furthermore, the circuit board with embedded elements 100 further includes one circuit layer 104 which is disposed on the thermal conductive insulation layer 150, while the thermal conductive insulation layer 150 is located between the circuit layer 104 and the circuit layer 134b of the circuit layer structure 130b. The thermal conductive insulation layer 150 may include thermal conductive adhesives or similarities thereof.

The circuit board with embedded elements 100 further includes the insulation material 170. The insulation material 170 is disposed on the conductive structure 140 and is distributed between the conductive structure 140 and the circuit substrate 120. In the embodiment, a spacing is located between one side surface (not denoted) of the conductive structure 140 and one inner side surface (not denoted) of the circuit substrate 120, while this spacing is filled with the insulation material 170. The insulation material 170 may include epoxy resin. It is worth mentioning, the edge surface 170e of the insulation material 170 is flush with the surface 120f of the circuit substrate 120.

It should be noted that the circuit board with embedded elements 100 may further include one layer of solder mask even through it is not illustrated in FIG. 1. The solder mask may cover the upper circuit layer 134a and the circuit layer 104 but expose a part of the upper circuit layer 134a and the circuit layer 104. In addition, the circuit board with embedded elements 100 may include the non-plating through hole (NPTH) 190. The non-plating through hole 190 connects two opposite sides of the circuit board with embedded elements 100 for forming an accommodation for screws or similar fixture components to be screwed on. Thus, the circuit board with embedded elements 100 may be fastened to other components (e.g. a circuit board).

The method for fabrication of a circuit board with embedded elements is provided, and the aforementioned circuit board with embedded elements 100 is taken as an example. The fabrication includes sequent steps illustrated in FIG. 2A to FIG. 2B and FIG. 3A to FIG. 3F. Referring to FIG. 2A, firstly, the conductive structure 140 which has the trench 142 is provided. The trench 142 may be formed on the conductive structure 140 by mechanical (e.g. computer numerical control machining) or laser grooving. Afterward, the electronic component 160 is disposed inside the trench 142 of the conductive structure 140.

The step that disposing the electronic component 160 inside the trench 142 of the conductive structure 140 includes disposing the metal sintering material (not shown) on the bottom of the trench 142 and further disposing the electronic component 160 on the metal sintering material. Afterward, the metal sintering material is adhered between the bottom of the trench 142 and the electronic component 160 by heating, so that the metal sintering layer 110 which connects the electronic component 160 with the trench 142 is formed.

Figure 2B:
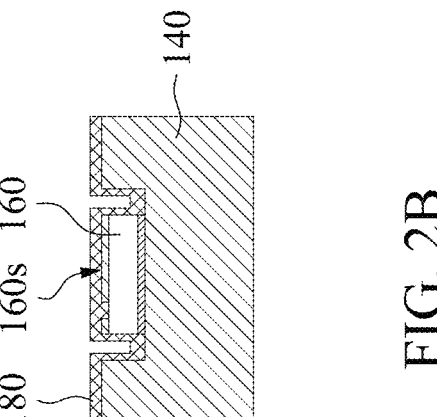
FIG. 2A to FIG. 2B illustrate cross-sectional views of intermediate processes for fabricating a circuit board with embedded elements in accordance with one embodiment of the present disclosure.
Figure 2A:
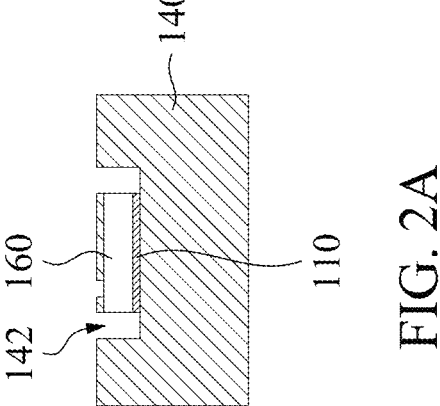

Referring to FIG. 2B, the thermoplastic insulation layer 180 is disposed on the conductive structure 140 after the electronic component 160 is disposed inside the trench 142, so that the thermoplastic insulation layer 180 covers the electronic component 160 and the trench 142. The thermoplastic insulation layer 180 may be formed on the electronic component 160 and a part of the conductive structure 140 by methods of spray coating and drying. It should be noted that the thermoplastic insulation layer 180 may surround the whole surface (including the side surface and the top surface) of the electronic component 160 in this embodiment.

Figure 3A:
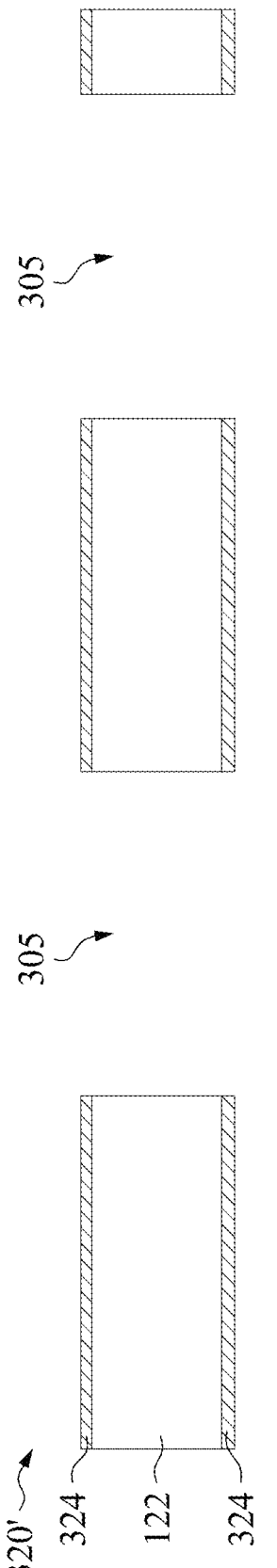
FIG. 3A to FIG. 3F illustrate cross-sectional views of intermediate processes for fabricating a circuit board with embedded elements in accordance with one embodiment of the present disclosure.

Referring to FIG. 3A, the method for fabrication of the circuit board with embedded elements 100 further includes providing the initial circuit substrate 320'. The initial circuit substrate 320' includes one insulation layer 122 and two metal layers 324, and the insulation layer 122 is located between these two metal layers 324. In the embodiment, the metal layers 324 may be metal foils (e.g. copper foils) and be adhered to two opposite sides of the insulation layer 122 separately.

Figure 3B:
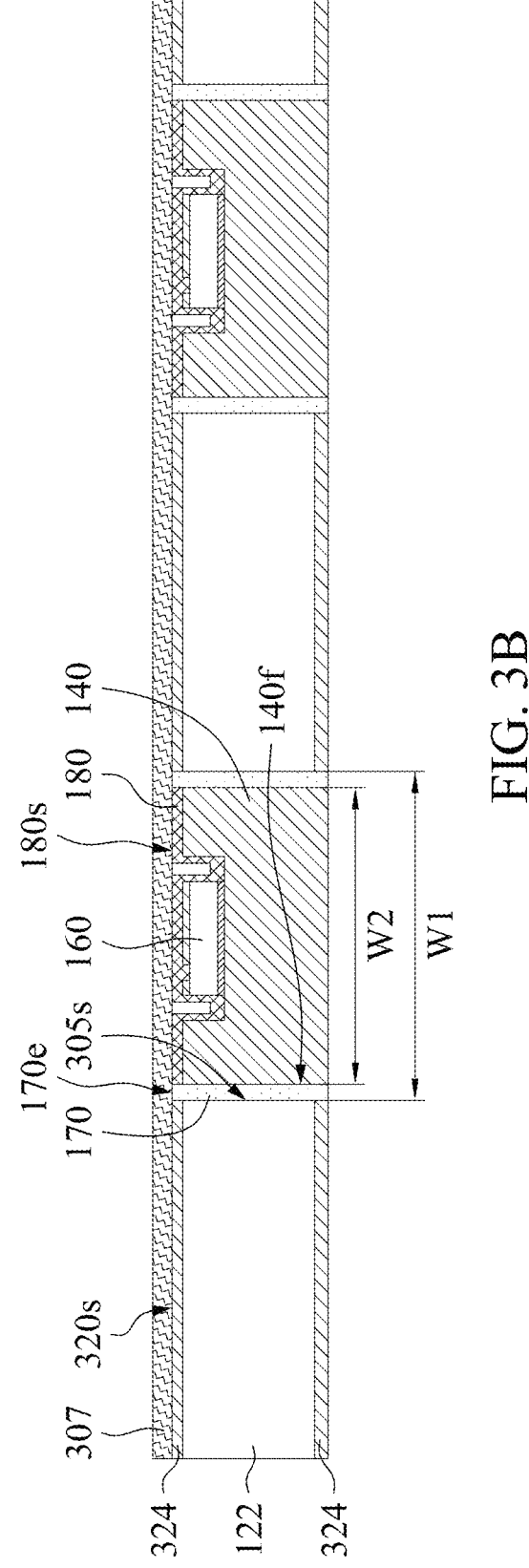

The conductive structure 140 is disposed inside the initial circuit substrate 320' after the thermoplastic insulation layer 180 is disposed on the conductive structure 140. Referring to FIG. 3A to FIG. 3B, those steps include removing a part of the initial circuit substrate 320' by mechanical cutting to form the plurality of opening 305 on the initial circuit substrate 320', and each opening 305 connect two opposite sides of the initial circuit substrate 320'. Although two openings 305 are formed on the initial circuit substrate 320' in the embodiment, the disclosure is not limited to this embodiment. In other embodiments, any quantity of the opening 305 (e.g. one opening 305 or three openings 305) may be formed on the initial circuit substrate 320'.

Afterward, as shown in FIG. 3B, the adhesive material 307 is disposed on the surface 320s of the initial circuit substrate 320', while the adhesive material 307 covers the openings 305. The adhesive material 307 may be an adhesive tape (e.g. a polyethylene terephthalate tape) or similarity thereof. After the adhesive material 307 is disposed, the conductive structure 140, the electronic component 160 and the thermoplastic insulation layer 180 which are formed by aforementioned steps in FIG. 2A to FIG. 2B are disposed inside the opening 305. The thermoplastic insulation layer 180 is adhered to the adhesive material 307, while the trench 142 of the conductive structure 140 within the opening 305 faces to the adhesive material 307.

It is worth mentioning, the width w1 of the opening 305 is larger than the width w2 of the conductive structure 140, and the difference between the width w1 of the opening 305 and the width w2 of the conductive structure 140 is larger than 0.5 mm. As a result, a spacing (not denoted) is formed between the inner surface 305s of the opening 305 and the side surface 140f of the conductive structure 140.

The insulation material 170 is disposed inside the opening 305 after the conductive structure 140, the electronic component 160 and the thermoplastic insulation layer 180 are disposed inside the opening 305, so that the insulation material 170 is distributed between the conductive structure 140 and the initial circuit substrate 320'. That is, the insulation material 170 is disposed inside aforementioned spacing.

After the insulation material 170 is disposed, the adhesive material 307 is removed to expose the thermoplastic insulation layer 180. Specifically, the surface 180s of the thermoplastic insulation layer 180 is exposed on the surface 320s of the initial circuit substrate 320', and the surface 180s is flush with the surface 320s. Furthermore, the surface 320s of the initial circuit substrate 320' is flush with the edge surface 170e of the insulation material 170.

The metal layers 324 of the initial circuit substrate 320' are patterned by lithography and etching after the conductive structure 140 is disposed inside the initial circuit substrate 320', even though this step is not illustrated in figures, so that the circuit layer 124a and the circuit layer 124b (shown in FIG. 1) are formed. Thus, the circuit substrate 120 which is illustrated in FIG. 1 is formed from the initial circuit substrate 320'.

Figure 3C:
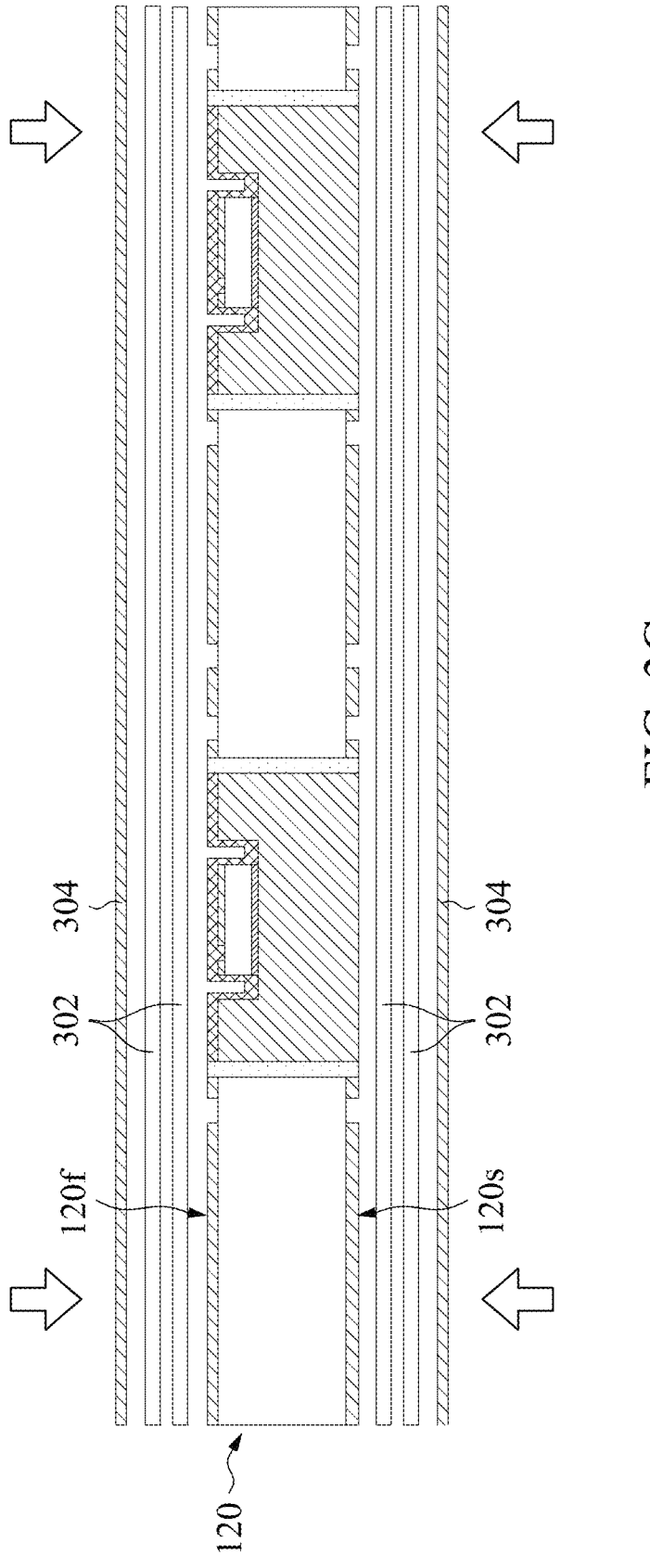

Referring to FIG. 3C, at least one insulation substrate 302 is adhered to each of two opposite surfaces (i.e. the surface 120f and the surface 120s) separately by heat lamination, so that the insulation layers 132a and the insulation layer 132b (denoted in FIG. 1) are formed. The circuit substrate 120 is located between the insulation layers 132a and the insulation layer 132b, while the insulation layers 132a cover the electronic component 160 and the trench 142. The insulation substrate 302 may be a prepreg consisting of materials with low coefficient of thermal expansion (CTE). Furthermore, in order to increase the insulation effect of the insulation layers 132a and the insulation layer 132b, the quantity of the insulation substrate 302 which is adhered to each side of the circuit substrate 120 (i.e. the surface 120f or the surface 120s) separately may be more than two in some embodiments.

In addition, the method for fabrication of the circuit board with embedded elements 100 further includes adhering one metal layer 304 to each of the insulation layer 132a and the insulation layer 132b separately by heat lamination. The insulation layer 132a is located between one of the metal layers 304 and the circuit substrate 120, while the insulation layer 132b is located between the other one of the metal layers 304 and the circuit substrate 120.

Figure 3D:
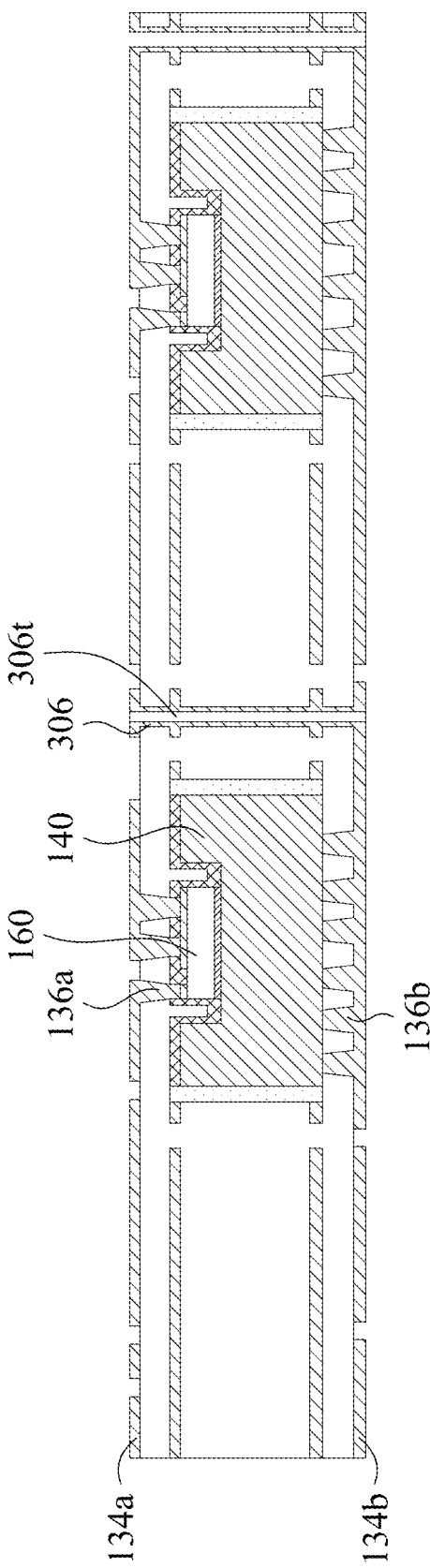

Afterward, referring to FIG. 3D, the plurality of conductive via 136a, the plurality of conductive via 136b and the plurality of conductive via 306 are formed on the metal layers 304 (shown in FIG. 3C) by mechanical grinding, mechanical drilling and electroplating after the metal layers 304 are adhered. Further, the conductive vias 306 are filled with the plugging materials 306t. In addition, the metal layers 304 are patterned by lithography and etching after aforementioned electroplating process, so that the circuit layer 134a and the circuit layer 134b are formed. The circuit layer 134a is electrically connected to the electronic component 160 through the conductive vias 136a.

Figure 3E:
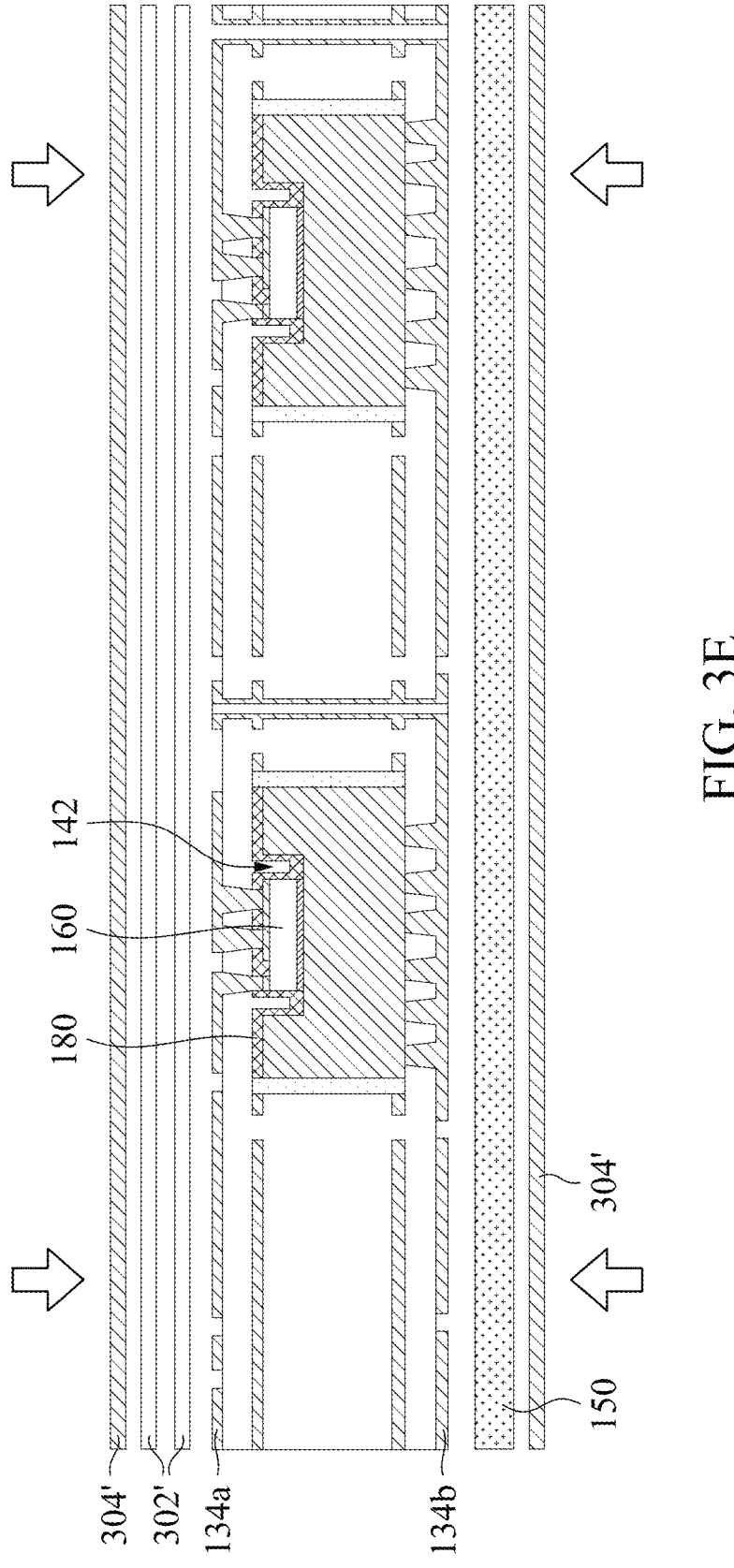

Afterward, referring to FIG. 3E, at least one insulation substrate 302' is adhered to the circuit layer 134a by heat lamination, so that the other insulation layer 132a (denoted in FIG. 1) is formed. This insulation layer 132a also covers the electronic component 160 and the trench 142. In order to increase the insulation effect of the insulation layer 132a, the quantity of the insulation substrate 302' may be more than two in some embodiments.

It should be noted that the method for fabrication of the circuit board with embedded elements 100 further includes adhering the thermal conductive insulation layer 150 to the circuit layer 134b in the embodiment. The conductive structure 140 is located between the thermal conductive insulation layer 150 and the thermoplastic insulation layer 180. In addition, this step further includes adhering one metal layer 304' to each of the upper insulation layer 132a and the thermal conductive insulation layer 150 separately by heat lamination. The upper insulation layer 132a is located between one of the metal layers 304' and the circuit layer 134a, while the thermal conductive insulation layer 150 is located between the other one of the metal layers 304' and the circuit layer 134b.

Figure 3F:
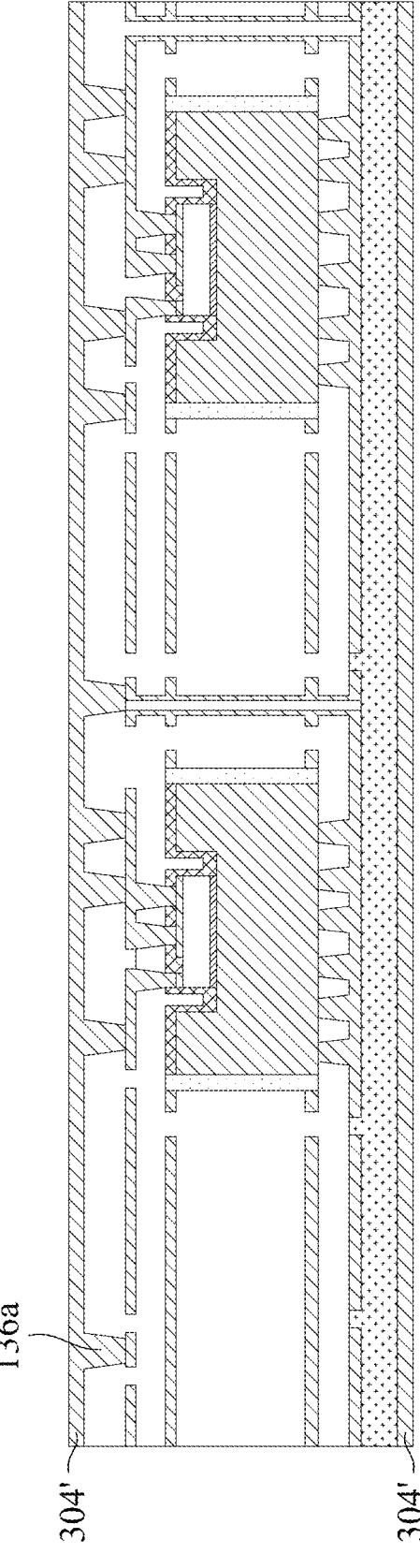

Afterward, referring to FIG. 3F, the plurality of conductive via 136a is formed on one metal layer 304' by mechanical grinding, mechanical drilling and electroplating after the metal layers 304' are adhered. In addition, the metal layers 304' are patterned by lithography and etching after aforementioned electroplating process, so that the other circuit layer 134a (shown in FIG. 1) and the circuit layer 104 (shown in FIG. 1) are formed.

The method for fabrication of the circuit board with embedded elements 100 further includes forming the non-plating through hole 190 inside the circuit substrate 120, the circuit layers 134a, the circuit layer 134b, the circuit layer 104, the insulation layers 132a, the insulation layer 132b and the thermal conductive insulation layer 150 by the method such as mechanical drilling in this embodiment after the metal layers 304' are patterned to form the other circuit layer 134a and the circuit layer 104, even though this step is not illustrated in figures. Thus, the circuit board with embedded elements 100 which is illustrated in FIG. 1 is formed approximately.

In conclusion, the thermoplastic insulation layer is disposed on the electronic component and the trench of the conductive structure, and this thermoplastic insulation layer covers the surface of the electronic component and a part of surface of the conductive structure, so that the adhesion strength between the electronic component (and the conductive structure) and the circuit layer structure which is above the electronic component. Since the heat deflection temperature of the thermoplastic insulation layer is between 376° C. and 410° C., the thermoplastic insulation layer is not deformed by heating when the temperature of the thermoplastic insulation layer reaches between 200° C. and 250° C. due to the heat generated by the electronic component or by circuit board processes (e.g. heat lamination). Further, the thermoplastic insulation layer is able to resist thermal stress by heating. Therefore, the surround of the thermoplastic insulation layer which covers the electronic component does not be damaged, thereby, sufficient insulation effect is provided. Thus, the performance of the circuit board with embedded elements is improved.

Moreover, the heat conductivity which is from the electronic component to external environment through the conductive structure is increased due to disposing the thermal conductive insulation layer on one side of the conductive structure, thereby increasing the heat dissipation of the circuit board with embedded elements. As a result, the heat which is accumulated within the electronic component is released, so that the electronic component is kept from malfunction due to the heat. Thus, the life time of the electronic component is prolonged.

Although the embodiments of the present disclosure have been disclosed as above in the embodiments, they are not intended to limit the embodiments of the present disclosure. Any person having ordinary skill in the art can make various changes and modifications without departing from the spirit and the scope of the embodiments of the present disclosure. Therefore, the protection scope of the embodiments of the present disclosure should be determined according to the scope of the appended claims.

What is claimed is:

1. A circuit board with embedded elements, comprising:
a circuit substrate;
a conductive structure disposed inside and is electrically connected to the circuit substrate, wherein the conductive structure has a trench;

an electronic component disposed inside the trench of the conductive structure and is electrically connected to the conductive structure; and a thermoplastic insulation layer covering the electronic component and an inner wall of the trench, and a first surface of the thermoplastic insulation layer is flush with a second surface of the circuit substrate;

wherein a heat deflection temperature of the thermoplastic insulation layer is between 376° C. and 410° C.

2. The circuit board with embedded elements of claim 1, wherein a thickness of the thermoplastic insulation layer is larger than 10 μm.

3. The circuit board with embedded elements of claim 1, further comprising:

two circuit layer structures, wherein the circuit substrate is disposed between and electrically connected to the circuit layer structures, and one of the circuit layer structures comprises:

an insulation layer disposed on the circuit substrate and covering the thermoplastic insulation layer; and a circuit layer disposed on the insulation layer, wherein the insulation layer is located between the circuit layer and the thermoplastic insulation layer.

4. The circuit board with embedded elements of claim 1, further comprising:

a thermal conductive insulation layer disposed on the circuit substrate, wherein the conductive structure is located between the thermal conductive insulation layer and the second surface of the circuit substrate.

5. The circuit board with embedded elements of claim 1, further comprising:

an insulation material disposed on the conductive structure and distributed between the conductive structure and the circuit substrate, wherein an edge surface of the insulation material is flush with the second surface of the circuit substrate.

6. The circuit board with embedded elements of claim 1, further comprising:

a metal sintering layer disposed on the conductive structure and located between the conductive structure and the electronic component.

7. The circuit board with embedded elements of claim 6, wherein the metal sintering layer includes silver.

8. The circuit board with embedded elements of claim 1, further comprising:

a non-plating through hole connecting two opposite sides of the circuit board with embedded elements.

9. A method for fabricating a circuit board with embedded elements, comprising:

providing a conductive structure, and the conductive structure has a trench;

disposing an electronic component inside the trench of the conductive structure;

disposing a thermoplastic insulation layer on the conductive structure after the electronic component is disposed inside the trench, so that the thermoplastic insulation layer covers the electronic component and the trench, wherein a heat deflection temperature of the thermoplastic insulation layer is between 376° C. and 410° C.;

providing an initial circuit substrate;

disposing the conductive structure inside the initial circuit substrate after the thermoplastic insulation layer is disposed on the conductive structure, wherein a first surface of the thermoplastic insulation layer is exposed on a second surface of the initial circuit substrate, and the first surface is flush with the second surface; and patterning a first metal layer of the initial circuit substrate to form a circuit layer after the conductive structure is disposed inside the initial circuit substrate, and a circuit substrate is formed from the initial circuit substrate.

10. The method of claim 9, wherein disposing the electronic component inside the trench of the conductive structure comprises:

disposing a metal sintering material on a bottom of the trench;

disposing the electronic component on the metal sintering material after the metal sintering material is disposed on the bottom of the trench; and adhering the metal sintering material between the bottom of the trench and the electronic component to form a metal sintering layer.

11. The method of claim 9, further comprising:

adhering at least one insulation substrate to each of two opposite third surfaces of the circuit substrate separately, so that two insulation layers are formed, wherein the circuit substrate is located between the insulation layers, and one of the insulation layers covers the electronic component and the trench;

adhering two second metal layers to the insulation layers separately, and each of the insulation layers is located between one of the second metal layers and the circuit substrate; and patterning the second metal layers after the second metal layers are adhered to the insulation layers, so that two second circuit layers are formed from the second metal layers, wherein the second circuit layers are electrically connected to the electronic component.

12. The method of claim 11, further comprising:

forming a plurality of conductive via on the second metal layers after the second metal layers are adhered, wherein the second circuit layers are electrically connected to the electronic component through the plurality of conductive via.

13. The method of claim 11, further comprising:

adhering one thermal conductive insulation layer to one of the second circuit layers of the circuit substrate, wherein the conductive structure is located between the thermal conductive insulation layer and the thermoplastic insulation layer.

14. The method of claim 9, wherein disposing the conductive structure inside the initial circuit substrate comprising:

removing a part of the initial circuit substrate to form an opening on the initial circuit substrate, and the opening connects two opposite sides of the initial circuit substrate with each other;

disposing an adhesive material on the second surface of the initial circuit substrate, and the adhesive material covers the opening;

disposing the conductive structure, the electronic component and the thermoplastic insulation layer inside the opening after the adhesive material is disposed, wherein the thermoplastic insulation layer is adhered to the adhesive material, and the trench of the conductive structure within the opening faces to the adhesive material;

disposing an insulation material inside the opening after the conductive structure, the electronic component and the thermoplastic insulation layer are disposed inside the opening, and the insulation material is distributed between the conductive structure and the initial circuit substrate; and

removing the adhesive material after the insulation material is disposed, so that the thermoplastic insulation layer is exposed.

15. The method of claim 14, wherein a width of the opening is larger than a width of the conductive structure, and the difference between the width of the opening and the width of the conductive structure is larger than 0.5 mm.

* * * * *